US009184061B2

(12) United States Patent
Vaartstra

(10) Patent No.: US 9,184,061 B2
(45) Date of Patent: Nov. 10, 2015

(54) SYSTEMS AND METHODS FOR FORMING ZIRCONIUM AND/OR HAFNIUM-CONTAINING LAYERS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 1909 days.

(21) Appl. No.: 11/493,967

(22) Filed: Jul. 27, 2006

(65) Prior Publication Data

US 2006/0261389 A1    Nov. 23, 2006

Related U.S. Application Data

(62) Division of application No. 10/229,779, filed on Aug. 28, 2002, now Pat. No. 7,112,485.

(51) Int. Cl.
| | |
|---|---|
| *H01L 29/78* | (2006.01) |
| *H01L 21/316* | (2006.01) |
| *C23C 16/40* | (2006.01) |
| *C23C 16/455* | (2006.01) |
| *C23C 16/56* | (2006.01) |

(Continued)

(52) U.S. Cl.
CPC ........ *H01L 21/31645* (2013.01); *C23C 16/401* (2013.01); *C23C 16/45531* (2013.01); *C23C 16/45553* (2013.01); *C23C 16/56* (2013.01); *H01L 21/0228* (2013.01); *H01L 21/02148* (2013.01); *H01L 21/02159* (2013.01); *H01L 21/02214* (2013.01); *H01L 21/02337* (2013.01); *H01L 21/3142* (2013.01); *H01L 21/31612* (2013.01); *H01L 21/31641* (2013.01)

(58) Field of Classification Search
CPC ................ H01L 29/78; H01L 29/4966; H01L 29/66545; H01L 29/513; H01L 21/28088; H01L 29/518
USPC .................................................. 257/410–413
See application file for complete search history.

(56) References Cited

U.S. PATENT DOCUMENTS

| | | |
|---|---|---|
| 5,195,018 A | 3/1993 | Kwon et al. |
| 5,885,877 A * | 3/1999 | Gardner et al. ............... 438/300 |

(Continued)

FOREIGN PATENT DOCUMENTS

| | | |
|---|---|---|
| CN | 1341955 A | 3/2002 |
| CN | 1902738 A | 1/2004 |

(Continued)

OTHER PUBLICATIONS

Gordon et al., Vapor Deposition of Metal Oxides and Silicates: Possible Gate Insulators for Future Microelectronics, *Chem. Mater.*, 2001; 13:2463-4. Available online Jul. 10, 2001.

(Continued)

*Primary Examiner* — Roy Potter
*Assistant Examiner* — Paul Patton
(74) *Attorney, Agent, or Firm* — Wells St. John P.S.

(57) ABSTRACT

A method of forming (and apparatus for forming) a zirconium and/or hafnium-containing layer on a substrate, particularly a semiconductor substrate or substrate assembly, using a vapor deposition process and one or more silicon precursor compounds of the formula $Si(OR)_4$ with one or more zirconium and/or hafnium precursor compounds of the formula $M(NR'R'')_4$, wherein R, R', and R" are each independently an organic group and M is zirconium or hafnium.

24 Claims, 2 Drawing Sheets

(51) Int. Cl.
*H01L 21/02* (2006.01)
*H01L 21/314* (2006.01)

(56) References Cited

U.S. PATENT DOCUMENTS

| | | | |
|---|---|---|---|
| 6,020,243 A | 2/2000 | Wallace et al. | |
| 6,040,594 A | 3/2000 | Otani | |
| 6,057,584 A * | 5/2000 | Gardner et al. | 257/411 |
| 6,060,755 A | 5/2000 | Ma et al. | |
| 6,080,645 A | 6/2000 | Pan | |
| 6,203,613 B1 | 3/2001 | Gates et al. | |
| 6,221,712 B1 | 4/2001 | Huang et al. | |
| 6,273,951 B1 | 8/2001 | Vaartstra | |
| 6,300,203 B1 | 10/2001 | Buynoski et al. | |
| 6,313,035 B1 | 11/2001 | Sandhu et al. | |
| 6,313,233 B1 | 11/2001 | Kurosawa et al. | |
| 6,316,064 B1 | 11/2001 | Onozawa et al. | |
| 6,335,049 B1 | 1/2002 | Basceri | |
| 6,426,307 B2 | 7/2002 | Lim | |
| 6,541,280 B2 | 4/2003 | Kaushik et al. | |
| 6,562,730 B2 * | 5/2003 | Jeng | 438/775 |
| 6,573,132 B1 * | 6/2003 | Uehara et al. | 438/211 |
| 6,573,182 B2 | 6/2003 | Sandhu et al. | |
| 6,586,792 B2 | 7/2003 | Ahn et al. | |
| 6,674,169 B2 | 1/2004 | Sandhu et al. | |
| 6,730,523 B2 | 5/2004 | Hintermaier et al. | |
| 6,744,108 B1 * | 6/2004 | Pan | 257/412 |
| 6,784,508 B2 * | 8/2004 | Tsunashima et al. | 257/411 |
| 6,831,315 B2 | 12/2004 | Raaijmakers et al. | |
| 6,844,604 B2 * | 1/2005 | Lee et al. | 257/410 |
| 6,849,300 B2 | 2/2005 | Kil et al. | |
| 6,869,638 B2 | 3/2005 | Baum et al. | |
| 6,884,675 B2 | 4/2005 | Chung et al. | |
| 6,884,719 B2 | 4/2005 | Chang et al. | |
| 6,958,300 B2 | 10/2005 | Vaartstra et al. | |
| 6,969,539 B2 | 11/2005 | Gordon et al. | |
| 7,005,392 B2 | 2/2006 | Baum et al. | |
| 7,029,985 B2 | 4/2006 | Basceri et al. | |
| 7,041,609 B2 | 5/2006 | Vaartstra | |
| 7,078,742 B2 * | 7/2006 | Lin et al. | 257/190 |
| 7,112,485 B2 | 9/2006 | Vaartstra | |
| 7,164,165 B2 | 1/2007 | Basceri et al. | |
| 7,214,979 B2 * | 5/2007 | Budge et al. | 257/296 |
| 7,306,994 B2 | 12/2007 | Tsunashima et al. | |
| 7,326,988 B2 * | 2/2008 | Yamamoto | 257/310 |
| 7,410,918 B2 | 8/2008 | Vaartstra | |
| 7,544,593 B2 | 6/2009 | Tsunashima et al. | |
| 7,947,610 B2 | 5/2011 | Tsunashima et al. | |
| 2001/0023120 A1 | 9/2001 | Tsunashima et al. | |
| 2001/0024387 A1 | 9/2001 | Raaijmakers et al. | |
| 2001/0041374 A1 | 11/2001 | Huntermaier et al. | |
| 2001/0053615 A1 | 12/2001 | Lim | |
| 2002/0098633 A1 * | 7/2002 | Budge et al. | 438/184 |
| 2002/0175393 A1 | 11/2002 | Baum et al. | |
| 2002/0187644 A1 | 12/2002 | Baum et al. | |
| 2003/0113480 A1 | 6/2003 | Kil et al. | |
| 2003/0213987 A1 | 11/2003 | Basceri et al. | |
| 2004/0009675 A1 * | 1/2004 | Eissa et al. | 438/745 |
| 2004/0040501 A1 | 3/2004 | Vaartstra | |
| 2004/0043149 A1 | 3/2004 | Gordon et al. | |
| 2004/0046197 A1 | 3/2004 | Basceri et al. | |
| 2005/0006675 A1 | 1/2005 | Tsunashima et al. | |
| 2005/0054213 A1 | 3/2005 | Derderian et al. | |
| 2005/0070126 A1 | 3/2005 | Senzaki | |
| 2005/0160981 A9 | 7/2005 | Vaartstra | |
| 2005/0287819 A1 | 12/2005 | Vaartstra et al. | |
| 2006/0081948 A1 * | 4/2006 | Lim et al. | 257/410 |
| 2006/0172485 A1 | 8/2006 | Vaartstra | |
| 2006/0261389 A1 | 11/2006 | Vaartstra | |
| 2008/0102616 A1 | 5/2008 | Tsunashima et al. | |
| 2009/0233451 A1 | 9/2009 | Tsunashima et al. | |

FOREIGN PATENT DOCUMENTS

| | | |
|---|---|---|
| CN | 1902738 | 1/2007 |
| EP | 1 048 627 A2 | 11/2000 |
| EP | 1 166 900 A2 | 1/2002 |
| EP | 1 193 309 A1 | 4/2002 |
| EP | 1 535 320 | 2/2004 |
| JP | 5-239650 | 9/1993 |
| JP | 07-176732 | 7/1995 |
| JP | 2000-188400 | 7/2000 |
| JP | 2001 108199 | 4/2001 |
| JP | 2002-053960 | 2/2002 |
| JP | 2002 060944 | 2/2002 |
| JP | 2003 347297 | 12/2003 |
| JP | 2008-277844 | 11/2008 |
| JP | 2008-300850 | 12/2008 |
| KR | 2001-0088450 | 9/2001 |
| KR | 2005-0042171 | 5/2005 |
| WO | WO 95/26355 A1 | 10/1995 |
| WO | WO 02/27063 A2 | 4/2002 |
| WO | WO 2004/017378 A2 | 2/2004 |
| WO | WO 2004/017378 A3 | 2/2004 |
| WO | WO 2004/020689 A2 | 3/2004 |
| WO | WO 2004/020690 A1 | 3/2004 |
| WO | WO 2004/020691 A2 | 3/2004 |
| WO | PCT/US03/27152 | 5/2004 |
| WO | PCT/US03/27152 | 7/2004 |

OTHER PUBLICATIONS

Hawley, *The Condensed Chemical Dictionary*, $10^{th}$ Edition, Van Nostrand Reinhold Co., New York, 1981; 225-226.

Hendrix et al., "Comparison of MOCVD precursors for $Hf_{1-x}Si_xO_2$/gate dielectric deposition," *Silicon Materials-Processing, Characterization and Reliability Symposium (Mater. Res. Soc. Proc.)*, Apr. 2002;716: 273-278.

Hiltunen et al., "Growth and characterization of aluminium oxide thin films deposited from various source materials by atomic layer epitaxy and chemical vapor deposition processes," *Materials Chemistry and Physics*, 1991; 28:379-388.

Jeon et al., "Atomic Layer Deposition of $Al_2O_3$ Thin Films Using Trimethylaluminum and Isopropyl Alcohol," *Journal of the Electrochemical Society*, 2002;149(6):C306-C310. Available online Apr. 12, 2002.

Killworth, "What is a patent?" *Vacuum Technology & Coating*, May 2002; pp. 32-34, 36-39.

Qi et al., Ultrathin Zirconium silicate film with good Thermal stability for alternative gate dielectric application, *Applied Physics Letters*, Sep. 11, 2000; 77(11):1704-6.

Ritala et al., "Atomic Layer Deposition of Oxide Thin Films with Metal Alkoxides as Oxygen Sources," *Science*, 2000; 288:319-21.

Wilk et al., "Hafnium and zirconium silicates for advanced gate dielectrics," *Journal of Applied Physics*, Jan. 1, 2000; 87(1):484-92.

Vehkamäki et al., "Growth of $SrTiO_3$ and $BaTiO_3$ Thin Films by Atomic Layer Deposition," *Electrochemical and Solid-State Letters*, 1999; 2(10):504-6.

Vioux, "Nonhydrolytic Sol-Gel Routes to Oxides," *Chem. Mater.*, 1997; 9(11):2292-9.

Leskelä et al., "Atomic Layer Deposition (ALD): from precursors to thin film structures," *Think Solid Films*, Apr. 2002;409:138-146.

Musgrave et al., "Precursors for Atomic Layer Deposition of High-k Dielectrics," *Future Fab Intl.*, Jan. 12, 2005;18: 6 pgs.

Matero et al., "Atomic Layer Deposition of $ZrO_2$ thin films using a new alkoxide precursor," *Journal of Non-Crystalline Solids*, May 2002;303:24-28.

Hendrix et al., "Composition of control of $Hf_{1-x}Si_xO_2$ films deposited on Si by chemical-vapor deposition using amide precursours," *Applied Physics Letters*, Apr. 1, 2002;80(13):2362-2364.

\* cited by examiner

SYSTEMS AND METHODS FOR FORMING ZIRCONIUM AND/OR HAFNIUM-CONTAINING LAYERS

This is a divisional of application Ser. No. 10/229,779, filed Aug. 29,2002, (pending), which is incorporated herein by reference.

FIELD OF THE INVENTION

This invention relates to methods of forming a layer on a substrate using one or more silicon precursor compounds and one or more zirconium and/or hafnium precursor compounds during a vapor deposition process. The precursor compounds and methods are particularly suitable for the formation of a metal silicate dielectric layer, particularly a zirconium and/or hafnium silicate dielectric layer, onto a semiconductor substrate or substrate assembly.

BACKGROUND OF THE INVENTION

Capacitors are the basic energy storage devices in random access memory devices, such as dynamic random access memory (DRAM) devices and static random access memory (SRAM) devices. They consist of two conductors, such as parallel metal or polysilicon plates, which act as the electrodes (i.e., the storage node electrode and the cell plate capacitor electrode), insulated from each other by a dielectric material.

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nm (i.e., a thickness of only 4 or 5 molecules), as is desired in the newest micro devices, the layer no longer effectively performs as an insulator due to the tunneling current running through it.

Thus, new high dielectric constant materials are needed to extend device performance. Such materials need to demonstrate high permittivity, barrier height to prevent tunneling, stability in direct contact with silicon, and good interface quality and film morphology. Furthermore, such materials must be compatible with the gate material, semiconductor processing temperatures, and operating conditions.

High quality dielectric materials based on $ZrO_2$ and $HfO_2$ have high dielectric constants, so are being investigated as replacements in memories for $SiO_2$ where very thin layers are required. These high crystalline multivalent metal oxide layers are thermodynamically stable in the presence of silicon, minimizing silicon oxidation upon thermal annealing, and appear to be compatible with metal gate electrodes.

This discovery has led to an effort to investigate various deposition processes to form layers, especially dielectric layers, based on zirconium and hafnium silicates. Such deposition processes have included vapor deposition, metal thermal oxidation, and high vacuum sputtering. Vapor deposition processes, which includes chemical vapor deposition (CVD) and atomic layer deposition (ALD), are very appealing as they provide for excellent control of dielectric uniformity and thickness on a substrate. But vapor deposition processes typically involve the co-reaction of reactive metal precursor compounds with an oxygen source such as oxygen or water, either of which can cause formation of an undesirable $SiO_2$ interfacial layer. Thus, an effort is underway to develop water- and oxygen-free vapor deposition processes.

Ritala et al., "Atomic Layer Deposition of Oxide Thin Films with Metal Alkoxides as Oxygen Sources," SCIENCE, 288:319-321 (2000) describe a chemical approach to ALD of thin oxide films. In this approach, a metal alkoxide, serving as both a metal source and an oxygen source, reacts with another metal compound such as a metal chloride or metal alkyl to deposit a metal oxide on silicon without creating an interfacial silicon oxide layer. However, undesirable chlorine residues can also be formed. Furthermore, zirconium and hafnium alkyls are generally unstable and not commercially available. They would also likely leave carbon in the resultant films.

Despite these continual improvements in semiconductor dielectric layers, there remains a need for a vapor deposition process utilizing sufficiently volatile metal precursor compounds that can form a thin, high quality zirconium silicate and/or hafnium silicate (or $SiO_2$ stabilized zirconium oxide and/or hafnium oxide) layer, particularly on a semiconductor substrate using a vapor deposition process.

SUMMARY OF THE INVENTION

This invention provides methods of vapor depositing a metal-containing layer on a substrate. These vapor deposition methods involve forming the layer by combining one or more zirconium and/or hafnium diorganoamide (e.g., dialkylamide) precursor compounds with one or more tetraorganooxysilane (e.g., tetraalkoxysilane) precursor compounds. Significantly, the methods of the present invention do not require the use of water or a strong oxidizer, thus reducing (and typically avoiding) the problem of producing an undesirable interfacial oxide layer between the desired metal-containing layer and the substrate. Typically and preferably, the layer is a dielectric layer that is primarily composed of zirconium silicate, hafnium silicate, zirconium-hafnium silicate, or related $SiO_2$-stabilized zirconium oxide and/or $SiO_2$-stabilized hafnium oxide.

The methods of the present invention involve forming a metal-containing layer on a substrate. Such methods include: providing a substrate (preferably a semiconductor substrate or substrate assembly such as a silicon wafer); providing at least one silicon precursor compound having the formula $Si(OR)_4$ and at least one precursor compound of the formula $M(NR'R'')_4$, wherein R, R', and R" are each independently an organic group and M is zirconium or hafnium; and contacting the precursor compounds to form a metal-containing layer (preferably a dielectric layer) on one or more surfaces of the substrate using a vapor deposition process.

Preferably, a method of the present invention involves: providing a substrate (preferably a semiconductor substrate or substrate assembly such as a silicon wafer) within a deposition chamber; providing at least one silicon precursor compound having the formula $Si(OR)_4$ and at least one precursor compound of the formula $M(NR'R'')_4$, wherein R, R', and R" are each independently an organic group and M is zirconium or hafnium; vaporizing the precursor compounds to form vaporized precursor compounds; and directing the vaporized precursor compounds toward the substrate to form a metal-containing layer (preferably a dielectric layer) on one or more surfaces of the substrate.

Another preferred method involves manufacturing a memory device structure, wherein the method includes: providing a substrate (preferably a semiconductor substrate or substrate assembly such as a silicon wafer) having a first electrode thereon; providing at least one silicon precursor compound having the formula $Si(OR)_4$ and at least one precursor compound of the formula $M(NR'R'')_4$, wherein R, R', and R'' are each independently an organic group and M is zirconium or hafnium; vaporizing the precursor compounds to form vaporized precursor compounds; directing the vaporized precursor compounds to the substrate to form a layer (preferably a dielectric layer) on the first electrode of the substrate; and forming a second electrode on the dielectric layer. Preferably, the dielectric forms a capacitor layer, although a gate is also possible.

The methods of the present invention can utilize a chemical vapor deposition (CVD) process, which can be pulsed, or an atomic layer deposition (ALD) process (a self-limiting vapor deposition process that includes a plurality of deposition cycles, typically with purging between the cycles). Preferably, the methods of the present invention use ALD. For certain ALD processes, the precursor compounds can be alternately introduced into a deposition chamber during each deposition cycle.

For certain embodiments, the metal-containing layer can include metal silicates (e.g., zirconium silicate, hafnium silicate, zirconium-hafnium silicate), metal oxides, silicon oxides, and combinations thereof. For certain embodiments, the metal-containing layer can include a solid solution that includes, for example, zirconium oxide, hafnium oxide, and silicon oxides.

The present invention also provides a vapor deposition apparatus that includes: a vapor deposition chamber having a substrate positioned therein; one or more vessels comprising one or more silicon precursor compounds having the formula $Si(OR)_4$; and one or more vessels comprising one or more one precursor compounds of the formula $M(NR'R'')_4$, wherein R, R', and R'' are each independently an organic group and M is zirconium or hafnium.

"Semiconductor substrate" or "substrate assembly" as used herein refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Dielectric layer" as used herein refers to a layer (or film) having a high dielectric constant containing primarily zirconium silicate and/or hafnium silicate (or $SiO_2$ stabilized zirconium oxide and/or hafnium oxide). Zirconium and hafnium silicates can be depicted by the simple condensed formulas $ZrSiO_4$ and $HfSiO_4$, respectively, but for this invention the terms "zirconium silicate" and "hafnium silicate" are meant to also include other stoichiometric reaction products of $SiO_2$, $ZrO_2$ and $HfO_2$ having the general formulas $Zr_aSi_bO_c$ and $Hf_aSi_bO_c$, respectively, wherein c=2 (a+b), which is meant to also include $SiO_2$ stabilized zirconium oxide and/or hafnium oxide. Metal-containing layers containing mixed zirconium/hafnium silicates of the general formula $Zr_aHf_bSi_cO_d$, wherein d=2 (a+b+c), are also contemplated to be included within the scope of this invention.

"Precursor compound" as used herein refers to a zirconium, hafnium, or silicon compound, for example, capable of forming, either alone or with other precursor compounds, a metal-containing layer on a substrate in a vapor deposition process. The zirconium, hafnium, and silicon precursor compounds are all preferably liquid at the vaporization temperature, and more preferably at room temperature. Preferably, the precursor compounds are organometallic compounds that form volatile by-products upon reacting.

"Deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor compounds are vaporized and directed to one or more surfaces of a heated substrate (e.g., semiconductor substrate or substrate assembly) placed in a deposition chamber. These precursor compounds form (e.g., by reacting or decomposing) a nonvolatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds (and any reaction gases used) within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chernisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE), molecular beam epitaxy (MBE), gas source MBE, organometallic MBE, and chemical beam epitaxy when performed with alternating pulses of precursor compound(s), reaction gas(es), and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (e.g., >30 kcal/mol), comparable in strength to ordinary chemical bonds. The chemisorbed species typically form a mononolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compounds or reaction gases are alternately introduced (e.g., pulsed) into a deposition chamber and chemisorbed onto the surfaces of a substrate. Each sequential introduction of a reactive compound (e.g., one or more precursor compounds and one or more reaction gases) is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood that ALD can alternately utilize one precursor compound, which is chemisorbed, and one reaction gas, which reacts with the chemisorbed species.

DETAILED DESCRIPTION OF PREFERRED EMBODIMENTS OF THE INVENTION

Figure 1:
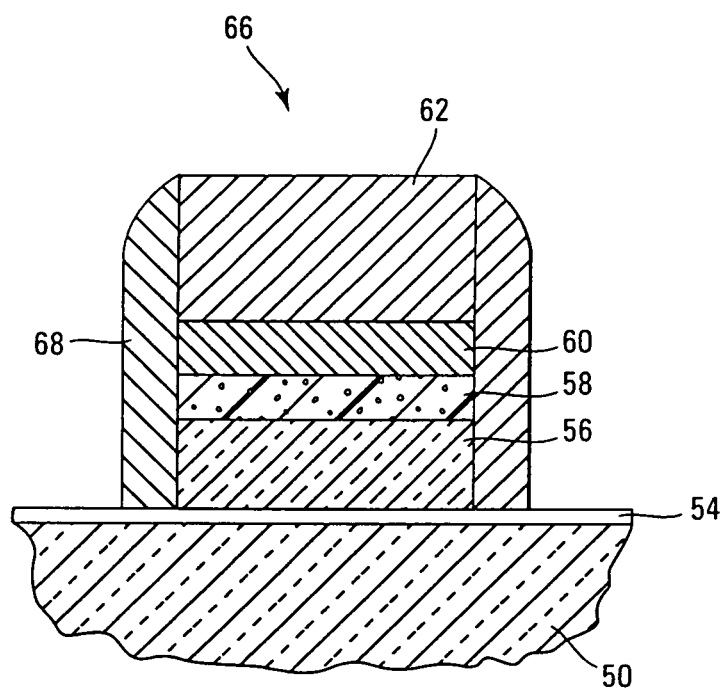
FIG. 1 is a cross-sectional view of a transistor made according to the present invention.

The present invention provides methods of forming a layer (preferably a zirconium and/or hafnium silicate layer) on a substrate (preferably a semiconductor substrate or substrate assembly) using one or more silicon precursor compounds of the formula $Si(OR)_4$ and one or more zirconium and/or hafnium precursor compounds of the formula $M(NR'R'')_4$, wherein R, R', and R'' are each independently an organic group and M is zirconium or hafnium.

The layers or films formed can be in the form of metal-containing films, which is used herein to refer to zirconium silicate, hafnium silicate, or zirconium-hafnium silicate, as well as solid solutions of oxides of zirconium, hafnium, and silicon (e.g., $SiO_2$ stabilized zirconium oxide and/or hafnium oxide). Various combinations of silicates and oxides are also possible.

The substrate on which the metal-containing layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and static random access memory (SRAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

The precursor compounds useful in this invention are of the formulas $Si(OR)_4$ and $M(NR'R'')_4$, wherein R, R', and R'' is each independently an organic group and M is zirconium or hafnium.

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal-containing layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

For all the precursor compounds of this invention, R is an organic group (preferably, an organic moiety), preferably a (C1-C10)alkyl group (preferably, an alkyl moiety), more preferably a (C1-C8)alkyl group (preferably, an alkyl moiety), even more preferably a (C1-C6)alkyl group (preferably, an alkyl moiety), and most preferably a "lower" (i.e., C1-C4) alkyl group (preferably, an alkyl moiety).

For the silicon precursor compounds of this invention having the formula $Si(OR)_4$, R is preferably a (C1-C8)alkyl group (preferably, an alkyl moiety), more preferably a (C1-C6)alkyl group (preferably, an alkyl moiety), and most preferably a "lower" (i.e., C1-C4) alkyl group (preferably, an alkyl moiety—methyl, ethyl, n-propyl, isopropyl, or butyl).

Preferably, all of the R groups are the same. A compound represented by the formula $Si(OR)_4$ has two commonly used equivalent names: either tetraorganoxysi lane (e.g., tetraalkoxysilane) or tetraorgano orthosilicate (e.g., tetraalkyl orthosilicate). Examples of suitable silicon precursor compounds include tetramethyl orthosilicate, tetraethyl orthosilicate, tetrapropyl orthosilicate, tetrabutyl orthosilicate, tetrakis(2-butoxyethyl) orthosilicate, and tetraallyl orthosilicate, all available from Sigma-Aldrich Chemical Co., Milwaukee, Wis.

The silicon precursor compounds can also be prepared by reacting one mole of tetrachlorosilane with four moles of the alcohol needed to provide the desired R groups. For example, tetraisopropoxysilane, a preferred silicon precursor compound, can be prepared by reacting tetrachlorosilane with isopropyl alcohol followed by distillation of the crude reaction product. Preferably, the silicon precursor compound is tetraisopropoxysilane or tetraethoxysilane.

For the zirconium precursor compounds of the formula $Zr(NR'R'')_4$, R' and R'' are preferably both methyl, both ethyl, or one each of methyl and ethyl. Examples of suitable zirconium precursor compounds include tetrakis(dimethylamino) zirconium, tetrakis(diethylamino) zirconium and tetrakis (ethylmethylamino) zirconium, all available from Sigma-Aldrich Chemical Co.

For the hafnium precursor compounds of the formula $Hf(NR'R'')_4$, R', and R'' are preferably both methyl, both ethyl, or one each of methyl and ethyl. Examples of suitable hafnium precursor compounds include tetrakis(dimethylamino) hafnium and tetrakis(ethylmethylamino) hafnium, the latter available from Sigma-Aldrich Chemical Co.

The zirconium and hafnium dialkylamide compounds offer the advantages (compared to other zirconium and hafnium precursor compounds) of high reactivity with surface groups, high volatility, volatile by-products, and optimized reactivity with tetraalkoxysilanes, for example.

The zirconium and hafnium dialkylamide compounds can be prepared using standard techniques. For example, zirconium and hafnium chlorides can be reacted with lithium dialkylamides. Alternatively, such compounds are commercially available. For example, tetrakis(dimethylamino) zirconium and tetrakis(dimentylamino)hafnium are available from Strem Chemical Co.

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc. Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

The solvents that are suitable for this application (particularly for a CVD process) can be one or more of the following: aliphatic hydrocarbons or unsaturated hydrocarbons (C3-C20, and preferably C5-C10, cyclic, branched, or linear), aromatic hydrocarbons (C5-C20, and preferably C5-C10), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, alcohols, or compounds containing combinations of any of the above or mixtures of one or more of the above. The compounds are also generally compatible with each other, so that mixtures of variable quantities of the precursor compounds will not interact to significantly change their physical properties.

For this invention, preferably no reaction gas is employed to minimize oxidation of the substrate (typically silicon) to its oxide (typically silicon dioxide); instead, the orthosilicate precursor compound provides the source of both the oxygen and the silicon to form the desired metal silicate layer.

The precursor compounds can be vaporized in the presence of an inert carrier gas if desired. Additionally, an inert carrier gas can be used in purging steps in an ALD process. The inert carrier gas is typically selected from the group consisting of nitrogen, helium, argon, and combinations thereof. In the context of the present invention, an inert carrier gas is one that does not interfere with the formation of the metal-containing layer. Whether done in the presence of a inert carrier gas or not, the vaporization is preferably done in the absence of oxygen to avoid oxygen contamination of the layer (e.g., oxidation of silicon to form silicon dioxide).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gases to form a metal-containing layer onto a substrate. It will be readily apparent to one skilled in the art that the vapor deposition process may be enhanced by employing various related techniques such as plasma assistance, photo assistance, laser assistance, as well as other techniques.

The final layer (preferably, a dielectric layer) formed preferably has a thickness in the range of about 10 Å to about 500 Å. More preferably, the thickness of the metal-containing layer is in the range of about 30 Å to about 80 Å.

In most vapor deposition processes, the precursor compound(s) are typically reacted with an oxidizing or reducing reaction gas (e.g., water vapor, oxygen or ammonia) at elevated temperatures to form the metal-containing layer. However, in the practice of this invention, no such reaction gas is needed as the silicon precursor compound(s) provide the source of oxygen needed in the vapor deposition process when reacting with the zirconium and/or hafnium precursor compound(s) to form the zirconium and/or hafnium silicate layer (i.e., no oxidizing or hydrolyzing co-reactant is needed). However, oxidizing gases, such as $O_2$, $O_3$, $H_2O$, and $H_2O_2$, can be used if desired.

Chemical vapor deposition (CVD) has been extensively used for the preparation of metal-containing layers, such as dielectric layers, in semiconductor processing because of its ability to provide highly conformal and high quality dielectric layers at relatively fast processing times. The desired precursor compounds are vaporized and then introduced into a deposition chamber containing a heated substrate with optional reaction gases and/or inert carrier gases. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compound and by the flow of an inert carrier gas bubbled through or passed over the reservoir.

Preferred embodiments of the precursor compounds described herein are particularly suitable for chemical vapor deposition (CVD). The deposition temperature at the substrate surface is preferably held at a temperature in a range of about 100° C. to about 600° C., more preferably in the range of about 200° C. to about 500° C. The deposition chamber pressure is preferably maintained at a deposition pressure of about 0.1 torr to about 10 torr. The partial pressure of precursor compounds in the inert carrier gas is preferably about 0.001 torr to about 10 torr.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of percursor and reactant gas streams. Also, for pulsed CVD, the deposition thickness is dependent on the exposure time, as opposed to ALD, which is self-limiting (discussed in greater detail below).

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Alternatively, and preferably, the vapor deposition process employed in the methods of the present invention is a multicycle ALD process. Such a process is advantageous (particularly over a CVD process) in that in provides for optimum control of atomic-level thickness and uniformity to the deposited layer (e.g., dielectric layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 150° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkämaki et al, "Growth of $SrTiO_3$ and $BaTiO_3$ Thin Films by Atomic Layer Deposition," Electrochemical and Solid-State Letters, 2(10):504-506 (1999)).

A typical ALD process includes exposing an initial substrate to a first chemical species (e.g., a silicon precursor compound) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different silicon precursor compound or a zirconium or hafnium precursor compound) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species. Optionally, the second species (or third or subsequent) can include at least one reaction gas if desired.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting.

Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) silicon precursor compound(s) and zirconium/hafnium precursor compound(s) (i.e., tetraalkoxysilane(s) or zirconium/hafnium dialkylamide(s)) into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{31\ 4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process can be optionally performed in situ in the deposition chamber in a nitrogen atmosphere or oxidizing atmosphere. Preferably, the annealing temperature is within the range of about 400° C. to about 1000° C. Particularly after ALD, the annealing temperature is more preferably about 400° C. to about 750° C., and most preferably about 600° C. to about 700° C. The annealing operation is preferably performed for a time period of about 0.5 minute to about 60 minutes and more preferably for a time period of about 1 minute to about 10 minutes. One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a metal-containing layer formed according to the present invention would be useful is as a gate dielectric with either silicon-based gates or novel metal gates. Referring now to FIG. 1, a patterned gate structure 66 is shown over substrate 50 and gate dielectric 54. This includes a gate polysilicon film 56, a barrier film 58 (e.g., nitrogen-doped polysilicon), a metallic layer 60, insulating cap 62 (e.g., silicon dioxide or silicon nitride), and sidewall spacers 68 (e.g., silicon dioxide or silicon nitride).

Figure 2:
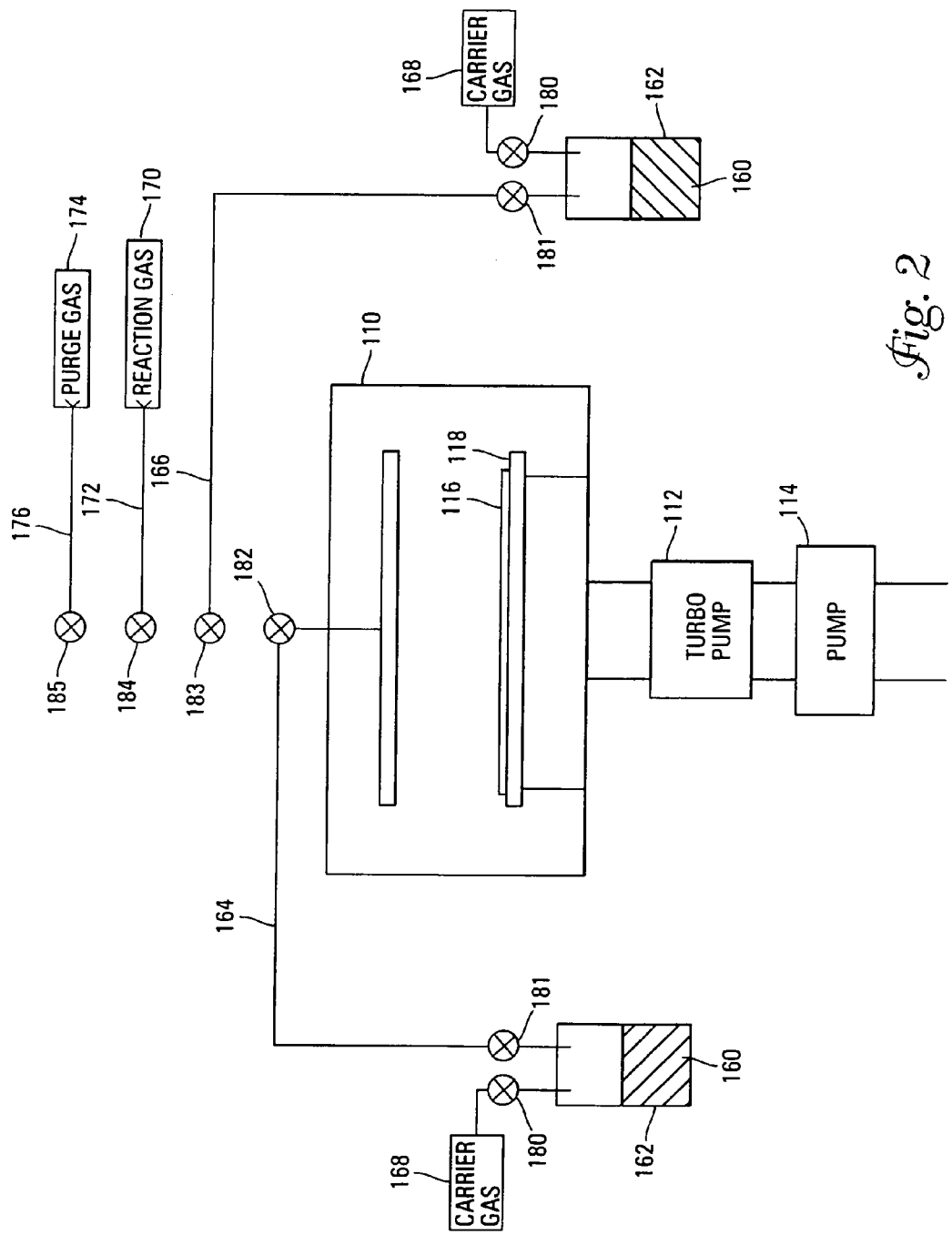
FIG. 2 is a perspective view of a vapor deposition coating system suitable for use in the method of the present invention.

A system that can be used to perform vapor deposition processes (chemical vapor deposition or atomic layer deposition) of the present invention is shown in FIG. 2. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a silicon precursor compound) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180-185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples. Unless specified otherwise, all percentages shown in the examples are percentages by weight.

EXAMPLES

Example 1

Synthesis of Tetraisopropoxysilane, $Si[OCH(CH_3)_2]_4$

A dry argon-purged flask equipped with stirrer and thermometer was charged with 100 mL of anhydrous isopropyl alcohol (having a water content of 230 ppm as determined by Karl Fischer Analysis). Then 25 mL of silicon tetrachloride (available from Sigma-Aldrich Co., Milwaukee, Wis.) was added slowly to the alcohol at ambient temperature over a 25 minute period by syringe. During the reaction the contents of the flask formed an emulsion and exothermed to 35° C.

After standing at ambient conditions for 24 hours, the contents of the flask had formed two layers. The lower layer along with some of the upper layer were transferred to a flask connected to a one-piece distillation apparatus. The isopropyl alcohol was removed from the reaction mixture by distilling at 78° C. and atmospheric pressure using an argon purge. During the distillation, by-product hydrogen chloride gas was vented from the system. Following alcohol and HCl removal, the crude reaction product was distilled at 166° C. without the argon purge to recover the purified reaction product, $Si[OCH(CH_3)_2]_4$, whose purity and identification was verified using GCMS analysis.

Example 2

Atomic Layer Deposition of $(Hf,Si)O_2$

Using an ALD process, precursor compounds hafnium dimethylamide, $Hf(N(CH_3)_2])_4$ (Strem Chemicals, Newbury Port, Mass.), and tetraisopropoxysilane, $Si[OCH(CH_3)_2]_4$, were alternately pulsed for 200 cycles into a deposition chamber containing a silicon substrate with a top layer composed of 1500 Angstroms of p-doped polysilicon. A 350 Å layer of $(Hf,Si)O_2$ was deposited, containing 25 atom % Hf, 10 atom % Si and oxygen. X-ray diffraction analysis (XRD) showed the layer to be amorphous, as measured immediately after the ALD process was completed and also after a 750° C./1 minute anneal in oxygen.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A device comprising:
    a substrate;
    a gate dielectric layer on the substrate, wherein the gate dielectric comprises mixed zirconium/hafnium silicates of the general formula $Zr_aHf_bSi_cO_d$, wherein d=2(a+b+c), each of a, b, c and d being greater than zero; and
    a titanium nitride gate on the gate dielectric layer;
    a nitrogen-doped barrier layer between the titanium nitride gate and the gate dielectric layer;
    wherein the gate dielectric layer is deposited by a vapor deposition process, and
    wherein the vapor deposition process further comprises providing at least one precursor compound of the formula $M(NR'R'')_4$, wherein R, R', and R'' are each independently an organic group and M is zirconium.

2. The device of claim 1 wherein the gate dielectric layer has a thickness of about 30 Å to about 80 Å.

3. The device of claim 1 further comprising a gate polysilicon film between the gate dielectric layer and the titanium nitride gate.

4. The device of claim 1 wherein the barrier layer comprises nitrogen-doped polysilicon.

5. The device of claim 1 further comprising an insulating cap on the gate dielectric layer.

6. The device of claim 5 wherein the insulating cap comprises silicon dioxide or silicon nitride.

7. The device of claim 1 wherein the substrate is a semiconductor substrate or substrate assembly.

8. The device of claim 7 wherein the semiconductor substrate or substrate assembly is a silicon wafer.

9. The device of claim 7 wherein the semiconductor substrate comprises conductively doped polysilicon.

10. A device comprising:
    a substrate;
    a gate dielectric layer on the substrate, wherein the gate dielectric comprises mixed zirconium/hafnium silicates of the general formula $Zr_aHf_bSi_cO_d$, wherein d=2(a+b+c), each of a, b, c and d being greater than zero; and
    a titanium nitride gate on the gate dielectric layer,
    a nitrogen-doped barrier layer between the titanium nitride gate and the gate dielectric layer;
    wherein the gate dielectric layer is deposited by a vapor deposition process, and
    wherein the vapor deposition process comprises providing at least one silicon precursor compound having the formula $Si(OR)_4$ and at least one precursor compound of the formula $M(NR'R'')_4$, wherein R, R', and R'' are each independently an organic group and M is hafnium.

11. The device of claim 1 wherein the vapor deposition process is a chemical vapor deposition process.

12. The device of claim 1 wherein the vapor deposition process is an atomic layer deposition process comprising a plurality of deposition cycles.

13. The device of claim 1 wherein the device forms at least a portion of a field effect transistor device.

14. A device comprising:
    a substrate;
    a gate dielectric layer on the substrate, wherein the gate dielectric comprises mixed zirconium/hafnium silicates of the general formula $Zr_aHf_bSi_cO_d$, wherein d=2(a+b+c), each of a, b, c and d being greater than zero; and
    a titanium nitride gate on the gate dielectric layer,
    a nitrogen-doped barrier layer between the gate dielectric layer and the titanium nitride gate;
    wherein the gate dielectric layer is deposited by a vapor deposition process, and wherein the vapor deposition process further comprises providing at least one precursor compound of the formula M(NR'R")$_4$, wherein R, R', and R" are each independently an organic group and M is hafnium.

15. A device comprising:
a substrate;
a gate dielectric layer on the substrate, wherein the gate dielectric comprises mixed zirconium/hafnium silicates of the general formula $Zr_aHf_bSi_cO_d$, wherein d=2(a+b+c), each of a, b, c and d being greater than zero;
a titanium nitride gate on the gate dielectric layer; and
a nitrogen-doped barrier layer between the gate dielectric layer and the titanium nitride gate.

16. The device of claim 15 wherein the gate dielectric layer has a thickness of about 30 Å to about 80 Å.

17. The device of claim 15 further comprising a gate polysilicon film between the gate dielectric layer and the titanium nitride gate.

18. The device of claim 15 wherein the barrier layer comprises nitrogen-doped polysilicon.

19. The device of claim 15 further comprising an insulating cap on the gate dielectric layer.

20. The device of claim 19 wherein the insulating cap comprises silicon dioxide or silicon nitride.

21. The device of claim 15 wherein the substrate is a semiconductor substrate or substrate assembly.

22. The device of claim 21 wherein the semiconductor substrate or substrate assembly is a silicon wafer.

23. The device of claim 21 wherein the semiconductor substrate comprises conductively doped polysilicon.

24. The device of claim 15 wherein the device forms at least a portion of a field effect transistor device.

\* \* \* \* \*